United States Patent [19]

Crockett et al.

[11] Patent Number: 4,795,983
[45] Date of Patent: Jan. 3, 1989

[54] METHOD AND APPARATUS FOR IDENTIFYING A FAULTED PHASE

[75] Inventors: John M. Crockett, Hamilton, Canada; Deborah K. Mort, Wilkins Township, Allegheny County, Pa.

[73] Assignee: Westinghouse Electric Corp., Pittsburgh, Pa.

[21] Appl. No.: 164,949

[22] Filed: Mar. 7, 1988

[51] Int. Cl.⁴ .................... G01R 31/08; H02H 3/34; H02H 3/36
[52] U.S. Cl. .................... 324/521; 361/76; 361/79; 364/483; 324/509; 324/522
[58] Field of Search ............. 324/520, 521, 522, 509, 324/512; 361/79, 85, 76; 364/483

[56] References Cited

U.S. PATENT DOCUMENTS

| | | | |
|---|---|---|---|
| 3,992,651 | 11/1976 | Hodges | 361/76 |
| 4,275,429 | 6/1981 | Church et al. | 361/76 |
| 4,321,681 | 3/1982 | Sackin et al. | 361/79 |
| 4,390,835 | 6/1983 | Elkateb et al. | 324/51 |
| 4,398,232 | 8/1983 | Elmore | 324/521 |
| 4,631,625 | 12/1986 | Alexander et al. | 364/483 |
| 4,751,653 | 6/1988 | Junk et al. | 361/76 |

*Primary Examiner*—Reinhard J. Eisenzopf
*Assistant Examiner*—Maura K. Regan
*Attorney, Agent, or Firm*—B. R. Studebaker

[57] ABSTRACT

Faults in a three-phase power transmission line are identified by vectorially subtracting from the postfault current for each phase, the zero sequence current and the prefault current. The resultant currents which are the vectorial sums of the postfault positive and negative sequence currents are then compared. If the magnitude of the resultant current in one phase exceeds that in each of the other two phases by a preselected factor, than one phase is identified as the phase to ground faulted phase. If the magnitudes of the resultant currents of two phases exceed that of the third, those two phases are involved in either a phase to phase or a phase to phase to ground fault with the distinction being made by the presence of zero sequence current in the later case.

13 Claims, 7 Drawing Sheets

METHOD AND APPARATUS FOR IDENTIFYING A FAULTED PHASE

BACKGROUND OF INVENTION

1. Field of the Invention

This invention relates to a method and apparatus for identifying a faulted phase or phases in a polyphase power line. More particularly, it relates to a method of identifying faults in a three-phase electric power system by vectorially subtracting the zero sequence current and prefault current from the postfault current to determine the fault type and phases involved.

2. Background Information

One of the functions of protective relaying systems used to isolate faults in electric power transmission lines is to identify the type of fault. Fault type identification includes determining if the fault is between phases or between one or more phases and ground and also determining the specific phase or phases involved in the fault. Proper faulted phase identification is required to avoid ground distance relay overreach on double line to ground faults which include ground fault resistance, for implementation of single-pole tripping for single line to ground faults, and for providing fault location information. The distance to the fault is computed from the fault impedance which is based on the voltages and currents of the faulted phases.

Current technology uses comparisons of different combinations of currents and voltages to determine fault type through mostly analog techniques. For example, previous phase selectors have selected the faulted phase based on phase comparison of zero sequence current and negative sequence current or voltage. These selectors identify as faulted the unfaulted phases during double line to ground faults. The selector utilizing zero and negative sequence currents may select two phases during a single line to ground fault if it is at a line terminal with substantial load but relatively small negative sequence current contribution to line faults.

One prior art phase selector based on phase comparison of zero sequence current, negative sequence voltage, and phase to phase voltage was intended to overcome the foregoing problems. However, it has been determined that, if ground fault resistance is involved, this phase selector may select the leading phase involved in a double line to ground fault and this is the situation where ground distance relay overreach may also occur.

The primary object of the present invention is to accurately identify the type of fault in a polyphase electric power line.

It is another important object of the invention to accurately identify the specific phase or phases involved in a fault.

It is also an object of the invention to achieve the previous objects regardless of fault resistance or load conditions.

SUMMARY OF INVENTION

These and other objects are realized by the invention in which the type of fault in a three-phase electric power line is identified by monitoring the power line currents, generating phasor representations of the monitored currents, and continually retaining the most recent phasor representations prior to a fault as prefault current phasor representations. Upon detection of the presence of a fault, resultant current phasor representations are generated from the prefault current phasor representations and from postfault current phasor representations generated after detection of the fault. The magnitudes of the resultant phasor representations are compared and the comparisons are used to determine the type of fault.

More particularly, phasor representations are generated and stored for each of the phase currents and for the zero sequence current. The resultant current phasor representations are generated by subtracting from the postfault phase current phasor representations the postfault zero sequence current phasor representation and the prefault current phasor representations. If the magnitude of the resultant current phasor representation of one phase exceeds that of both of the other phases by a preselected amount which is preferably a factor of at least about 1.4, then that phase is designated as the phase of a single phase to ground fault. Reliable indication of a single phase to ground fault only requires that a breaker pole in the faulted phase be opened.

If the magnitude of the resultant current phasor representation for two of the phases each exceed that of the third phase by a preselected amount, such as a factor of at least about 1.4, those two phases are designated as phases of either a phase to phase or a phase to phase to ground fault. In the exemplary system, it is not necessary to distinguish between the phase to phase and phase to phase to ground type faults since in either case breakers in all three phases of the power line will be opened. However, the distinction can be easily made by checking the postfault zero sequence current. When this current is essentially zero, it is a phase to phase fault. On the other hand, the presence of a postfault zero sequence current indicates that it is a phase to phase to ground fault.

The present invention, which encompasses both a method and apparatus, provides a reliable easily derived indication of the type of fault which has occurred in a three-phase power line regardless of the location of the fault, fault resistance, or load condition.

BRIEF DESCRIPTION OF THE DRAWINGS

A full understanding of the invention can be gained from the following description of the preferred embodiments when read in conjunction with the accompanying drawings in which:

FIGS. 2b, 2c, and 2d are positive, negative, and zero sequence diagrams respectively of the system of FIG. 2a.

DESCRIPTION OF THE PREFERRED EMBODIMENT

Figure 1:
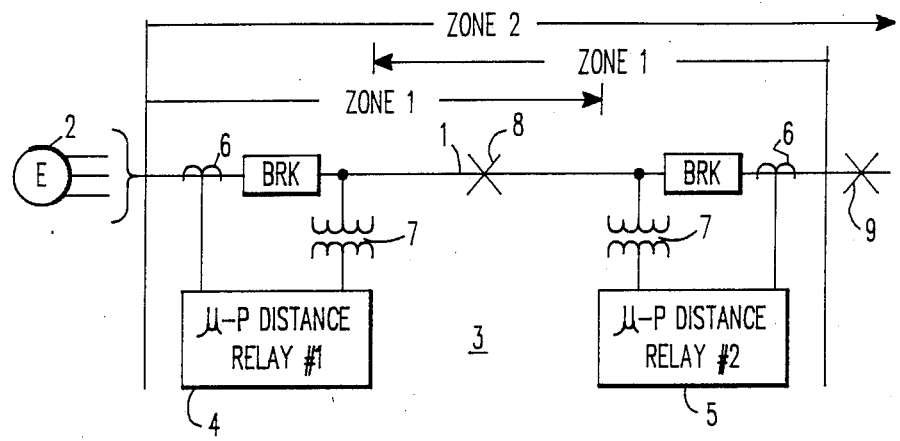
FIG. 1 is a schematic representation of a power system to which the invention is applied.

FIG. 1 illustrates a power system to which the invention is applied. This system includes a power line 1 fed by a generator 2. All components are three-phase, but only a single phase is shown for clarity. The power line is protected by a protective relay system 3 which includes as protective relays, two microprocessor based distance relays 4 and 5.

These protective relays 4 and 5 monitor the three-phase currents through current transformers 6 and the three phase to ground voltages through potential transformers 7. The distance relays 4 and 5 derive from the phase currents inputs the zero sequence current.

The exemplary protective relays 4 and 5 are digital systems which sample the instantaneous analog magnitudes of the power line voltages and currents several times per second for input to a microprocessor which generates phasor or vector representations of these parameters using a conventional waveform analysis routine such as for example, a Fourier algorithm.

The microprocessors of the protection relays 4 and 5 perform a number of relaying computations with the vector representations of the power line currents and voltages including detection of an instantaneous overcurrent condition using known techniques. More particularly, a distance algorithm determines the presence of a fault within a zone of protection. In the system of FIG. 1, protective relay 4 looks to the right in zone 1 and relay 5 looks to the left in the same zone. These relays detect the presence of an internal fault 8 within the zone 1 by determining the impedance from the current and voltage phasors. The protective relay 4, can also detect the presence of an external fault 9 by a zone 2 distance algorithm. The faulted phasor identification feature of the present invention determines which phase or phases are involved in a fault regardless of the location or the direction of the fault. The protective relays 4 and 5 are connected to breakers BRK to protect against faults in the power line 1.

The present invention utilizes sequence analysis to identify the type of fault. Sequence analysis is a well known technique for analyzing unbalanced polyphase circuits. With this analysis, the currents and voltages are resolved into three sets of phasors with all phasors in each set being of equal magnitude. The positive sequence set of phasors appear in the sequence of phase rotation of the line currents and voltages, the negative sequence phasors appear in the opposite sequence, and the zero sequence phasors are all in phase.

Figure 2A:
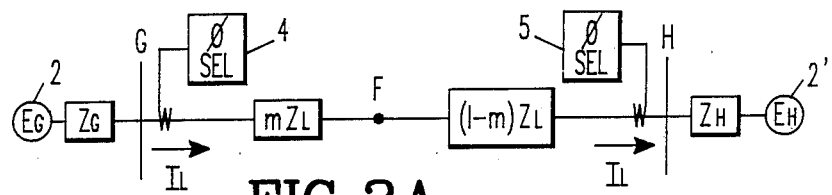
FIG. 2a is a simplified circuit diagram of the power system of FIG. 1.
Figure 2B:
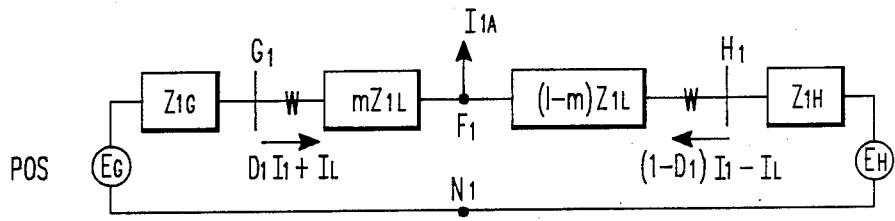

FIG. 2a depicts a simplified electric circuit for the system of FIG. 1. This circuit includes two generators, voltages $E_G$ and $E_H$, with impedances $Z_{GL}$ and $Z_H$ respectively connected by line $Z_L$. Under normal no fault conditions, a load current $I_L$ flows from G to H. FIGS. 2b, c and d illustrate positive, negative and zero sequence diagrams for the system of FIG. 2a. As noted in these figures, the subscripts 1, 2 and 0 denote the positive, negative and zero sequence components respectively of each parameter.

Figure 2C:
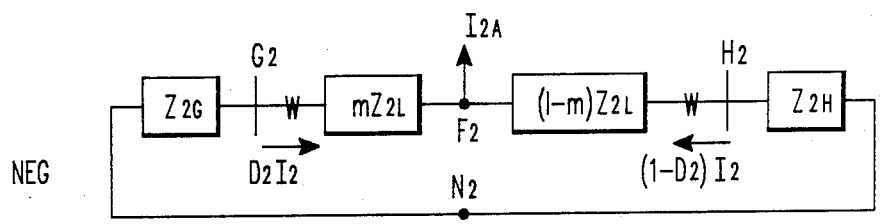
Figure 2D:
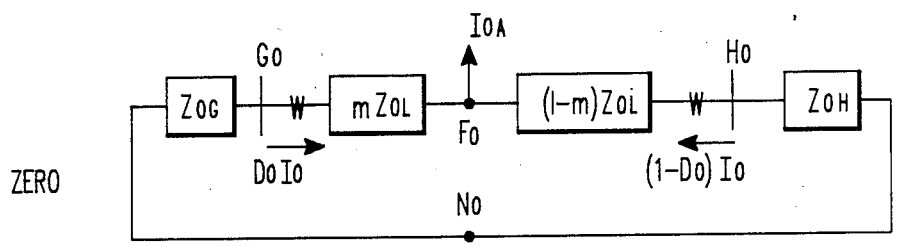

In FIG. 2c, each negative sequence impedance can be considered, for all practical purposes, to be equal to the corresponding positive sequence impedance of FIG. 2b. Similarly, the fault current distribution factors, $D_1$ and $D_2$ can be considered equal. It is this equality of negative and positive sequence impedances and current distribution factors which is the key to the success of the present invention.

Figure 3:
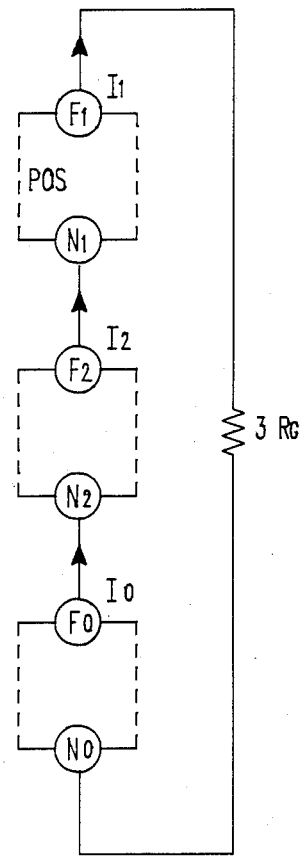
FIG. 3 illustrates the connection between the sequence networks of FIG. 2 for a phase A to ground fault.
Figure 4A:
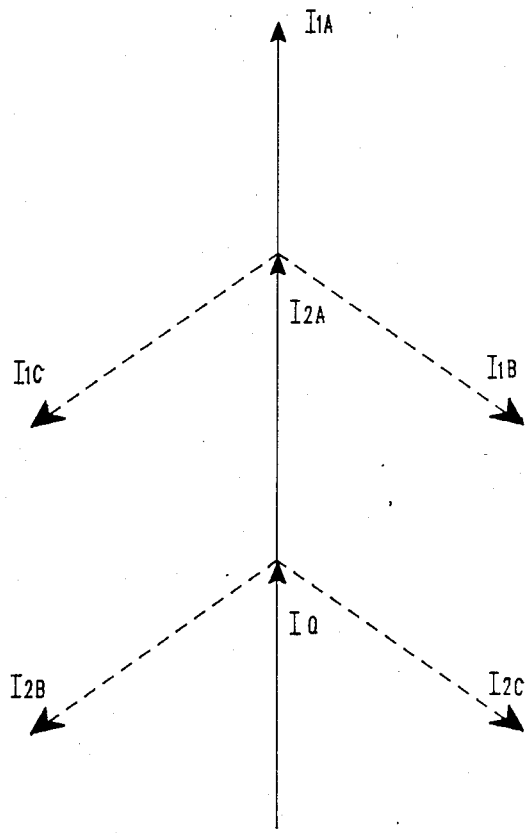
FIG. 4a is a phasor diagram of the currents for a phase A to ground fault.

FIG. 3 illustrates the connection between the sequence networks of FIGS. 2b, c and d (shown symbolically for clarity), for a phase A to ground fault involving fault resistance $R_G$. As indicated by FIG. 4a, $I_{1A}$, $I_{2A}$ and, $I_{0A}$, the phase A sequence currents at the fault for the phase A to ground fault are all equal and in phase. The sum of these phase A sequence currents yields the faulted phase current in the fault, $I_{AF}$, shown in FIG. 4b. $R_G$ will influence the magnitude of $I_{AF}$, but does not alter the equality of $I_1$, $I_2$, and $I_0$. Similarly, because $R_G$ is outside the sequence networks, it has no influence on the current distribution factors $D_1$, $D_2$ and $D_0$.

Figures 4B, 4C:
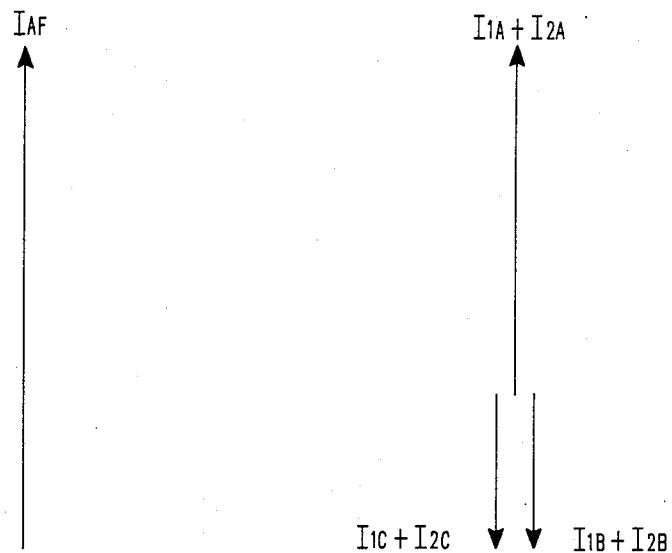
FIG. 4b illustrates the resultant phasor diagram under such fault conditions.
FIG. 4c illustrates the vectorial sums of the positive and negative sequence currents for each of the phases for the phase A to ground fault.

As can be seen from FIG. 4b, the positive and negative sequence currents for the unfaulted phases, B and C, are not in phase. While not shown in this Figure, $I_0$ for phase B and C are equal to, and in phase with the zero sequence current for phase A. FIG. 4c illustrates that the sum of the positive and negative sequence currents at the fault for phase A, $I_{1A}+I_{2A}$, is twice the magnitude of both $I_{1B}+I_{2B}$, and $I_{1C}+I_{2C}$. This magnitude comparison can be used then to identify the phase involved in a single line to ground fault.

Figures 5, 6:
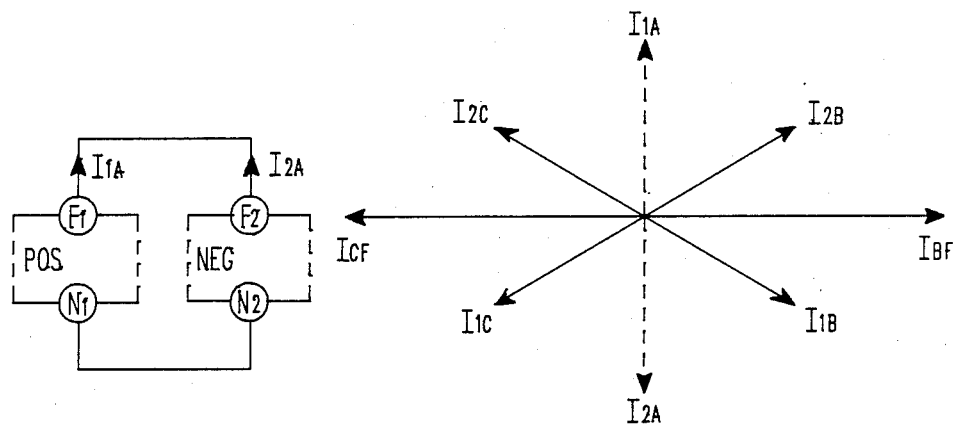
FIG. 5 illustrates the connection of the sequence circuits for a phase B to phase C fault.
FIG. 6 illustrates the phasor diagram for the phase B to phase C fault.

In FIG. 5, the sequence networks are connected for a phase B to phase C fault. The connection of the phase A sequence networks is shown since, by convention, phase A is the reference phase, however, the networks for phases B and C are similar. FIG. 6 is the phasor diagram for this phase to phase fault. It should be noted that at the fault the sum $I_{BF}$ of the positive and negative sequence currents, $I_{1B}+I_{2B}$, is the same magnitude as $I_{1C}+I_{2C}=I_{CF}$, while $I_{1A}+I_{2A}$ equals zero.

Figure 7:
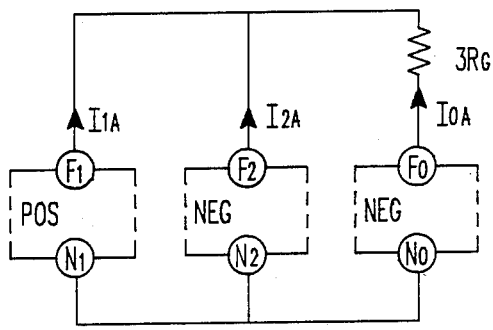
FIG. 7 illustrates the connection of the sequence diagrams for a phase B to phase C to ground fault.
Figure 8:
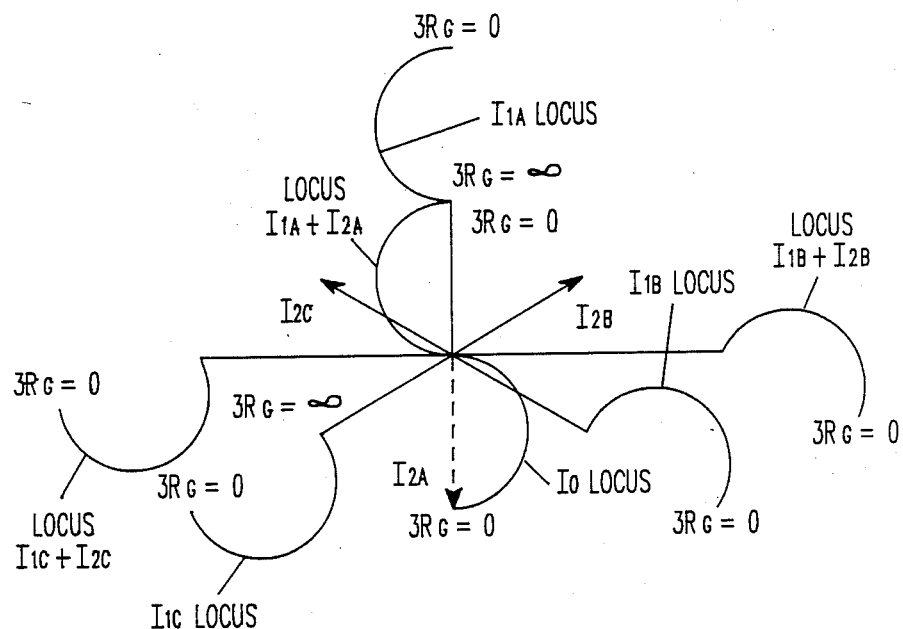
FIG. 8 illustrates the phasor diagram for the phase B to phase C to ground fault.

FIG. 7 illustrates the connection of the sequence networks for the reference phase, A, for a B to C to ground fault in which the network impedances are assumed equal and reactive in order to derive the phasor diagram of FIG. 8. In this latter figure, the phasors for the positive and zero sequence currents extend from the origin to the point on the associated locus representative of the particular ground resistance. Thus, it can be seen from FIG. 8 that ground fault resistance, $R_G$, influences the magnitude and phase of the positive and, zero sequence currents, $I_1$ and $I_0$, of each phase relative to the associated $I_2$.

This effect of the ground fault resistance on the magnitude and phase relation of the phasors is one reason earlier phase selectors made erroneous selections during double line to ground faults. On the other hand, it will be noticed that in all cases, the magnitudes of the sums of the positive and negative sequence currents of the two-phases faulted to ground are equal and are much larger than that of the unfaulted phase.

Figure 9:
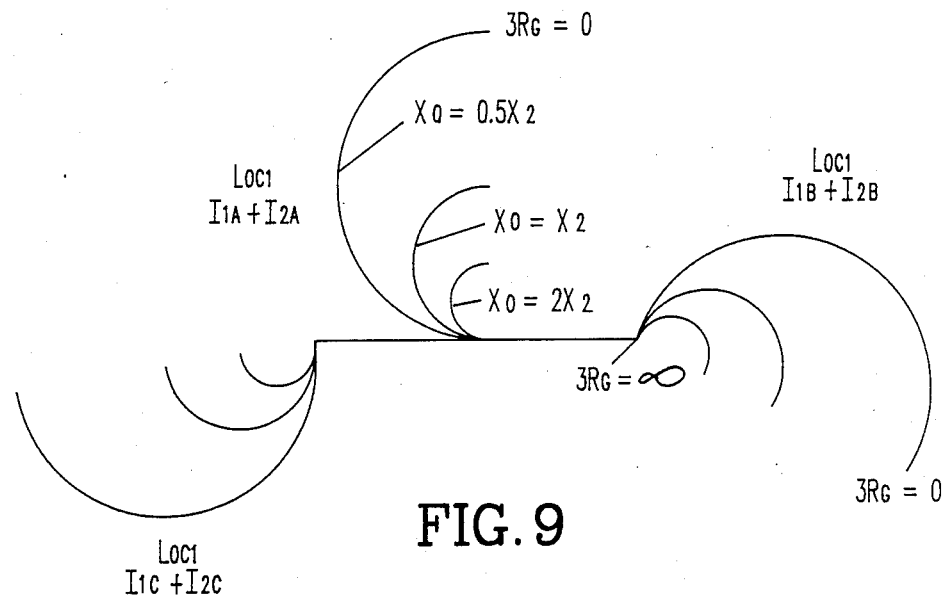
FIG. 9 depicts the loci of the sums of the positive and negative sequence currents for a range of values of the zero and negative sequence reactive components of line impedance and for a range of ground resistances from zero to infinity for a phase B to phase C to ground fault.
Figure 10:
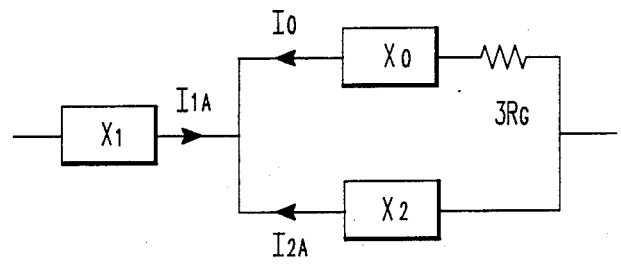
FIG. 10 illustrates the correction of the impedances in the sequence network for the fault depicted in FIG. 9.

In FIG. 9, possible loci for $I_{1A}+I_{2A}$, $I_{1B}+I_{2B}$ and $I_{1C}+I_{2C}$ are shown for a practical range of the ratio of the reactive component of the zero sequence impedance, $X_0$, to that of the negative sequence impedance, $X_2$, from 0.5 to 2, and for ground fault resistance, $3R_G$, ranging from zero to infinity for a phase B to C to ground fault. The connection of these impedances in the sequence network is shown in FIG. 10.

Figure 11:
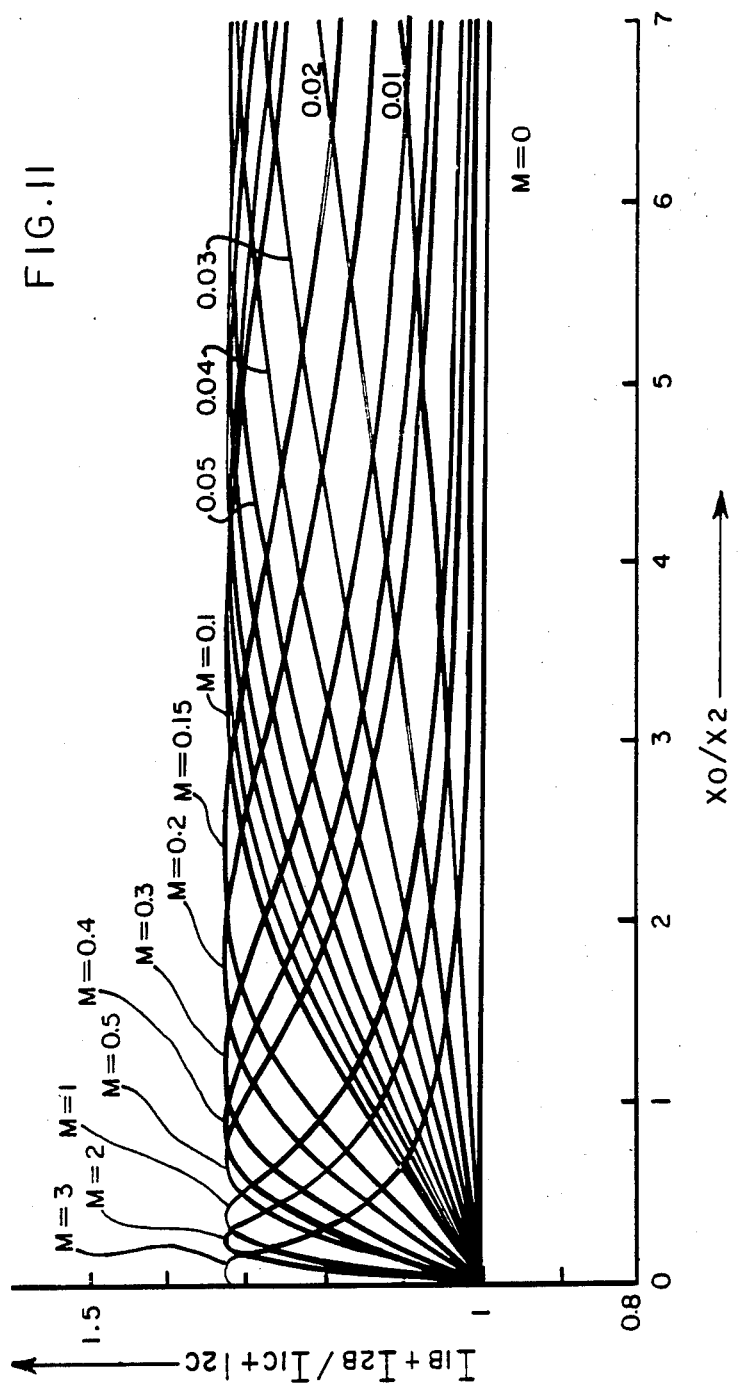
FIG. 11 is a plot of the ratio of the sum of the positive and negative sequence currents for the two phases of a phase to phase to ground fault as a function of the ratio of the zero sequence to negative sequence reactive impedance.

FIG. 11 is a plot of the ratio $(I_{1B}+I_{2B})/(I_{1C}+I_{2C})$ for $X_0/X_2$ from 0 to 7 and for $R_G/X_0$ from 0 to 3 where:

$$\left| \frac{I_{1B}+I_{2B}}{I_{1C}+I_{2C}} \right| = \left| \frac{3\sqrt{3} MK + \frac{1}{2} + j\sqrt{3}(K+1)}{3\sqrt{3} MK - \frac{1}{2} + j\sqrt{3}(K+1)} \right|$$

and $$M = R_G/X_0$$

$$K = X_0/X_1$$

As can be seen from FIG. 11, the ratio remains between 1 and 1.35.

An examination of FIGS. 4c, 6 and 11, shows that only in the case of a single line to ground fault (FIG. 4c) will the sum of the positive and negative sequence currents at the fault be twice as large for one phase as for the other two phases. Thus, a means exists to identify that a fault is a single line to ground fault and to identify the faulted phase. A practical ratio to look for is 1.5, which is comfortably within the limits of 1.35 and 2. These figures also show that for phase to phase and phase to phase to ground faults the sum of the positive and negative sequence currents at the fault for the two faulted phases will be within a factor 1 to 1.35 of each other for practical values of line impedances and all values of ground resistance, so that such faults can be reliably identified when the sums of the positive and sequence components at the fault for two phases are both more than 1.35 times larger than that for the third phase.

The relationships established for currents at the fault can be deduced from currents available from the current transformers 6 in FIG. 1 when it is recognized that:
1. Before the fault, the available current is the load current.
2. After the fault, the available current is the load and fault current.
3. The derivation of $I_1+I_2$ fault components is a relatively simple matter of subtracting the zero sequence current and prefault current from the fault current.

The advantage of deducing fault components $I_1+I_2$ at the line terminals becomes apparent. Because $Z_1=Z_2$ and $D_1=D_2$, the ratio of $I_1+I_2$ from phase to phase will be substantially the same at the actual current transformer location as at the fault.

In implementing the invention, the microprocessor based protective relays 4 and 5 of FIG. 1 receive seven analog inputs including three phase to ground voltages $V_{AG}$, $V_{BG}$ and $V_{CG}$, the three phase currents $I_A$, $I_B$ and $I_C$ and the zero sequence current $3I_0$. Each of the analog inputs is sampled in the exemplary system 8 times per cylce and converted to rectangular coordinates or phasors using, for example, the known Full Cycle Fourier Algorithm. Only the current phasors $I_A$, $I_B$, $I_C$ and $I_0$ are utilized in the fault identification algorithm run by the microprocessors in the protective relays 4 and 5. The most recent phasors are retained on a continual basis. When a fault occurs, the retained most recent phasors represent the prefault currents, while the phasors then calculated represent the postfault currents.

In the implementation of the invention, the inputs are:
$I_{AL}$, $I_{BL}$, $I_{CL}$ Measured prefault load currents
$3 I_{0M}$, $I_{AM}$, $I_{BM}$, $I_{CM}$ Measured postfault currents The fault currents are determined by removing the zero sequence current from the postfault current and subtracting the prefault current in accordance with the calculations:

$$I_0 = 3I_{0M}/3$$

(the zero sequence currents are all equal)

RESULTANT FAULT CURRENT PHASORS $$\Delta I_A = I_{AM} - I_0 - I_{AL}$$

$$\Delta I_B = I_{BM} - I_0 - I_{BL}$$

$$\Delta I_C = I_{CM} - I_0 - I_{CL}$$

$$I^2_A = [\text{real } (\Delta I_A)]^2 + [\text{imag } (\Delta I_A)]^2$$

$$I^2_B = [\text{real } (\Delta I_B)]^2 + [\text{imag } (\Delta I_B)]^2$$

$$I^2_C = [\text{real } (\Delta I_C)]^2 + [\text{imag } (\Delta I_C)]^2$$

The magnitudes of the resultant fault currents are then compared. To avoid taking square roots, the squares of the magnitudes are compared. To simplify and speed up the mathematics, a factor of 2 is used to compare the ratio of currents since this only requires a shift of the binary representation of the magnitude within the microprocessor. Thus:

$$(1.5)^2 = 2.25 \approx 2$$

$$\sqrt{2} = 1.4$$

Using 2 for comparing the ratios of the square of the currents results in a reference value of 1.4 instead of the 1.5 referred to above. This value is still above the 1.35 value identified from FIG. 11.

Figure 12:
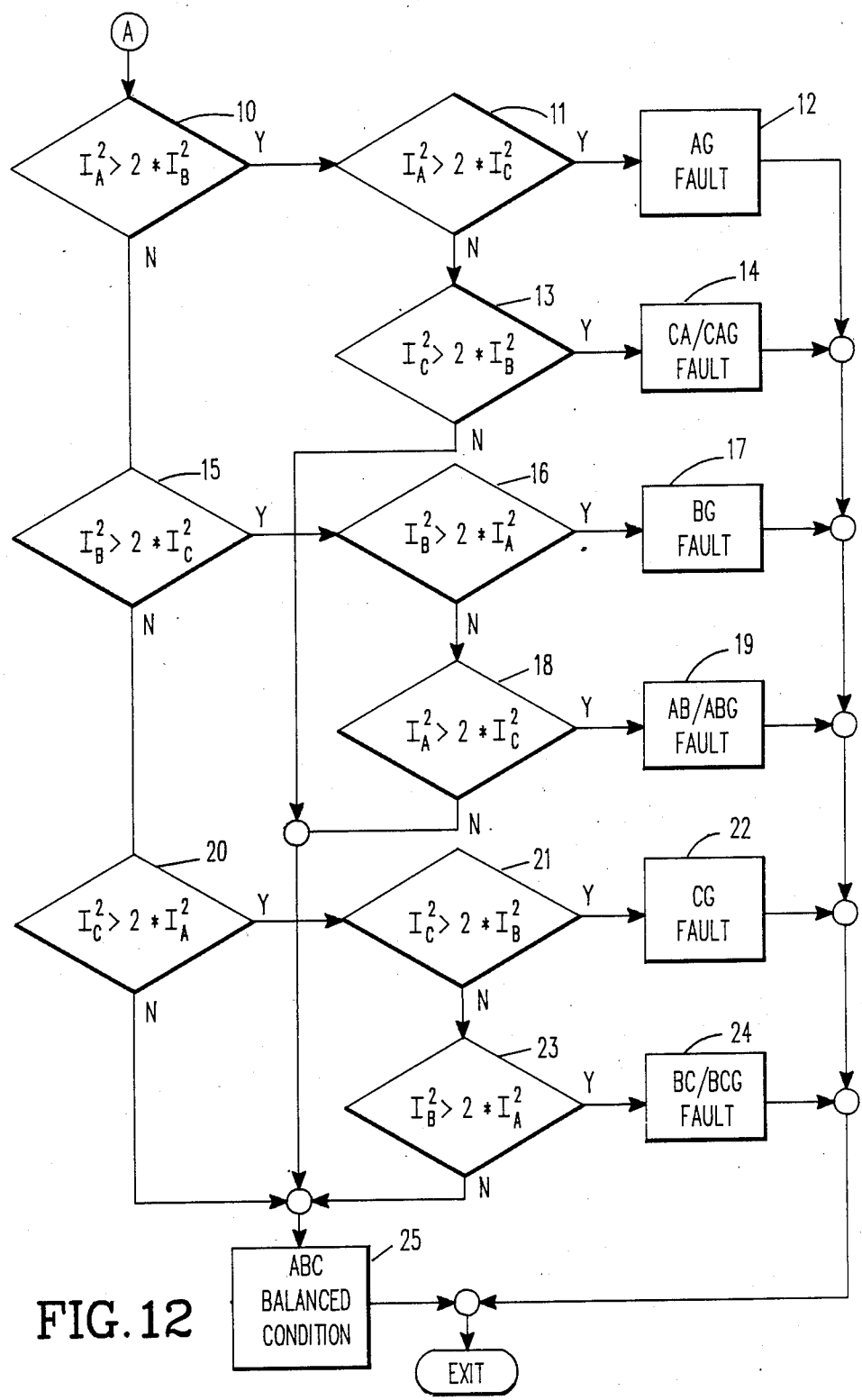
FIG. 12 is a block diagram of the program used by the invention to identify faults in the system of FIG. 1.

FIG. 12 is a flow diagram illustrating the manner in which the comparisons are made for identifying a fault type. $IA^2$ is compared with $I_B^2$ at 10. If $IA^2$ is more than twice $I_B^2$ and is also more than twice $I_C^2$ as determined at 11, the fault is identified at 12 as a single line to ground fault in phase A. If $I_A^2$ and $I_C^2$ are both more than twice $I_B^2$, as determined by the sequence 10, 11, 13 in FIG. 12, then a phase A and C line to line, or line to line to ground fault is identified at 14. It is not necessary for the routine to distinguish between a phase to phase fault and a two phase to ground fault because in either case the desired response is to trip all three-phases. However, the determination can be easily made by checking the zero sequence current. For a two-phase to ground fault there will be a sizable zero sequence current, while for a phase to phase fault there will be no zero sequence current.

Simiarly, if $I_B^2$ is more than twice $I_C^2$ 15, and $I_A^2$, at 16, a single phase to ground fault in phase B is identified at 17. On the other hand, if $I_B^2$, 15, and $I_A^2$ at 18, both exceed $I_C^2$ by a factor of 2, the fault is a phase A to phase B line to line, or two line to ground fault at 19.

Likewise, if $I_C^2$ exceeds both $I_A^2$ at 20, and $I_B^2$ at 21, by a factor of two, a phase C to ground fault is indicated at at 22. In addition, when $I_C^2$ at 20 and $I_B^2$ at 23 are both at least twice as large as $I_A^2$, a phase B to C, phase to phase or two phase to realign last part of line ground fault is identified at 24. All other combinations of the magnitudes of the values $I_A^2$, $I_B^2$ and $I_C^2$ are considered balanced conditions at 25. A determination of whether such a balanced condition is a three-phase fault is made through other functions of the protective relay which rely on measures of impedances within zones of protection as is known in the art.

The results of the algorithm can be summarized by the following table:

TABLE

| | Faulted Phase Selection | | | | | | | | |
|---|---|---|---|---|---|---|---|---|---|
| | Fault Type | | | | | | | | |
| | AG | BG | CG | AB | BC | CA | ABG | BCG | CAG |
| $|\Delta I_A| > 1.5 \times |\Delta I_B|$ | X | | | | X | | | | X |
| $|\Delta I_A| > 1.5 \times |\Delta I_C|$ | X | | X | | | X | | | |
| $|\Delta I_B| > 1.5 \times |\Delta I_A|$ | | X | | | X | | | X | |
| $|\Delta I_B| > 1.5 \times |\Delta I_C|$ | | X | X | | | X | | | |
| $|\Delta I_C| > 1.5 \times |\Delta I_A|$ | | | X | X | | | | X | |
| $|\Delta I_C| > 1.5 \times |\Delta I_B|$ | | | | X | | X | | | X |

As discussed previously, a factor of 1.5 provides a preferred margin between resultant phase current magnitudes, but a factor of about 1.4 produced by using a factor of 2 in comparing the squares of the resultant currents lends itself to easier implementation in the code of the microprocessor based protective relays.

As can be appreciated from the above, the present invention provides a reliable easily implemented method and apparatus for correctly identifying single line to ground faults regardless of fault resistance and load conditions, and for correctly identifying line to line faults.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. A method of identifying the type of fault in a three-phase electric power line comprising the steps of:
   monitoring the power line currents,
   generating phasor representations of said monitored currents,
   continually retaining the most recent phasor representations prior to a fault as prefault current phasor representations,
   detecting the presence of a fault, and
   upon detection of a fault, generating resultant current phasor representations from said prefault current phasor representations and from postfault current phasor representations generated after detection of said fault,
   comparing magnitudes of said resultant current phasor representations, and
   identifying the type of fault as a function of the comparisons.

2. The method of claim 1 wherein monitoring the power line currents includes determining each phase current and a zero sequence current for the power line, wherein generating phasor representations includes generating phasor representations of each phase current and the zero sequence current, and wherein generating said resultant currents comprises subtracting from the postfault phasor representation for each phase current, the postfault zero sequence current phasor representation and the prefault phase current phasor representation for that phase.

3. The method of claim 2 wherein the step of identifying includes designating as a single phase to ground faulted phase, a phase for which said comparing step indicates that the magnitude of the resultant current phasor representation for that phase exceeds the magnitude of the resultant current phasor representations for each of the other two phases by a preselected amount.

4. The method of claim 3 wherein said preselected amount by which the magnitude of the relevant current phasor representation for the designated phase exceeds that of the other phases is a factor of at least about 1.4.

5. The method of claim 4 wherein said factor is about 2.

6. The method of claim 2 wherein the step of identifying includes designating as phases of a type of fault including phase to phase and phase to phase to ground faults, those phases for which the comparing step indicates that the magnitude of the resultant current phasor representations for those phases both exceed the resultant current phasor representation for the remaining phase by a preselected amount.

7. The method of claim 6 wherein said preselected amount by which the magnitude of the resultant current phasor representations for the designated phases exceed that of the other phase is a factor of at least about 1.4.

8. The method of claim 6 including, when two phases are designated as phases of a type of fault including phase to phase and phase to phase to ground faults, checking the magnitude of the postfault zero sequence current phasor representation and identifying said designated phases as the phases of a phase to phase fault when the magnitude of the postfault zero sequence current phasor representation is essentially zero, and identifying said designated phases as the phases of a phase to phase to ground fault when the magnitude of the postfault zero sequence current phasor representation is not essentially zero.

9. The method of claim 6 wherein said step of indentifying includes designating as a single phase to ground faulted phase, a phase for which said comparing step indicates that the magnitude of the resultant current phasor representation for that phase exceeds the magnitude of the resultant current phasor representation for each of the other two phases by a preselected amount.

10. A system for identifying the type of fault in a three-phase electric power line comprising:
  means for generating signals representative of the currents and voltages in said power line;
  micro-processor based relay means including:
    means to periodically sample said current and voltage signals and to generate therefrom current and voltage phasor representations;
    means to store the most recent phasor representations as prefault current and voltage phasor representations;
    means to detect the presence of a fault;
    means responsive to the detection of a fault to generate resultant current phasor representations from said prefault current phasor representations and from postfault current phasor representations generated after detection of said fault;
    means to compare magnitudes of said resultant current phasor representations; and
    means identifying the type of fault as a function of the comparisons; and
  means responsive to the type of fault identified for opening appropriate phases of the power line.

11. The system of claim 10 wherein the means for generating signals representative of the currents in said power line include means for generating signals representative of the currents in each phase of the power line and of the zero sequence current; wherein the means generating phasor representations includes means generating phasor representations of each phase current and the zero sequence current, and wherein the means generating said resultant currents comprise means subtracting from the postfault phasor representation for each phase current, the postfault zero sequence current phasor representation and the prefault current phasor representation for that phase.

12. The system of claim 11 wherein said means for identifying the type of fault includes means designating as a single phase to ground faulted phase, a phase for which said comparing means indicates that the magnitude of the resultant current phasor representation for that phase exceeds the magnitude of the resultant current phasor representation for each of the other two phases by a preselected amount and designating as phases of a type of fault including phase to phase and phase to ground faults, those phases for which the comparing means indicates that the magnitude of the resultant current representations for those phases both exceed the resultant current phasor representation for the remaining phase by a preselected amount.

13. The system of claim 12 wherein the means for designating phases includes means for setting said preselected amount at at least a factor of 1.4.

* * * * *